(12) United States Patent
De Rybel et al.

(10) Patent No.: US 9,759,755 B2
(45) Date of Patent: Sep. 12, 2017

(54) HIGH VOLTAGE MEASUREMENT SYSTEMS

(75) Inventors: Tom De Rybel, Nieuwekerken (BE); Eric Vandewinckel, Rotselaar (BE)

(73) Assignees: EANDIS, Melle (BE); KATHOLIEKE UNIVERSITEIT LEUVEN, Leuven (BE)

( * ) Notice: Subject to any disclaimer, the term of this patent is extended or adjusted under 35 U.S.C. 154(b) by 665 days.

(21) Appl. No.: 14/007,399

(22) PCT Filed: Mar. 26, 2012

(86) PCT No.: PCT/EP2012/055353
§ 371 (c)(1),
(2), (4) Date: Sep. 25, 2013

(87) PCT Pub. No.: WO2012/130816
PCT Pub. Date: Oct. 4, 2012

(65) Prior Publication Data
US 2014/0021965 A1    Jan. 23, 2014

(30) Foreign Application Priority Data

Mar. 25, 2011 (EP) ..................... 11159761

(51) Int. Cl.
*G01R 27/32* (2006.01)
*G01R 15/16* (2006.01)
*G01R 15/06* (2006.01)

(52) U.S. Cl.
CPC ............. *G01R 27/32* (2013.01); *G01R 15/06* (2013.01); *G01R 15/16* (2013.01)

(58) Field of Classification Search
CPC .......... G01R 31/02; G01R 27/32; H04B 3/46
See application file for complete search history.

(56) References Cited

U.S. PATENT DOCUMENTS 4,241,373 A    12/1980   Lecourt et al.
4,320,338 A *   3/1982   Morris ............... G01R 27/2605
                                                      324/539

(Continued)

FOREIGN PATENT DOCUMENTS

DE    37 02 735 A1    8/1988
DE    195 15 068 A1   10/1996
KR    2010-0094748 A   8/2010

OTHER PUBLICATIONS

International Search Report of PCT/EP2012/055353 dated Jul. 24, 2012.

*Primary Examiner* — Jermele M Hollington
*Assistant Examiner* — Alvaro Fortich
(74) *Attorney, Agent, or Firm* — Sughrue Mion, PLLC

(57) ABSTRACT

Described herein is a method and apparatus for measuring the potential on a modern shielded high-voltage cable such as those used in medium-voltage distribution networks. A capacitive sensor arrangement (100) is constructed on a cable (110) using pre-existing structures (114, 116, 118, 120) within the cable (110). The use of implicit guarding methods is also described that allows the use of the semiconductor layer (116) present in modern cable design to be retained and to form part of the capacitive sensor arrangement (100). Performance of the sensor arrangement (100) can also be improved using temperature compensation techniques.

14 Claims, 14 Drawing Sheets

(56) References Cited

U.S. PATENT DOCUMENTS

| | | | | |
|---|---|---|---|---|
| 4,510,516 A * | 4/1985 | Bartelink | G11C 11/22 | 257/296 |
| 5,051,733 A | 9/1991 | Neuhouser | | |
| 5,519,324 A * | 5/1996 | Tachikiri | G01R 31/14 | 324/509 |
| 5,902,962 A * | 5/1999 | Gazdzinski | G02B 6/4416 | 174/113 R |
| 6,086,792 A * | 7/2000 | Reid | H01B 1/24 | 174/102 SC |
| 6,236,218 B1 * | 5/2001 | Johansson | G01R 31/1209 | 324/536 |
| 6,479,968 B1 * | 11/2002 | Pozsgay | H02J 7/0073 | 320/137 |
| 6,489,782 B1 * | 12/2002 | Baier | G01R 31/1245 | 324/509 |
| 2002/0171433 A1 | 11/2002 | Watanabe et al. | | |
| 2003/0067312 A1 * | 4/2003 | Pfaff | G01R 31/311 | 324/754.23 |
| 2005/0218905 A1 | 10/2005 | Prunk | | |
| 2007/0274014 A1 * | 11/2007 | Berberich | H01L 23/642 | 361/91.7 |
| 2009/0120676 A1 * | 5/2009 | Rohm | H05K 3/046 | 174/260 |
| 2010/0001744 A1 * | 1/2010 | Hirayama | C23C 16/345 | 324/645 |
| 2012/0306510 A1 * | 12/2012 | White | G01R 31/021 | 324/551 |

\* cited by examiner

HIGH VOLTAGE MEASUREMENT SYSTEMS

CROSS REFERENCE TO RELATED APPLICATIONS

This is a National Stage of International Application No. PCT/EP2012/055353 filed Mar. 26, 2012, claiming priority based on European Patent Application No. 11159761.3 filed Mar. 25, 2011, the contents of all of which are incorporated herein by reference in their entirety.

TECHNICAL FIELD

The present invention relates to high voltage measurement systems, and is more particularly concerned with a contactless, cable-based alternating high voltage measurement system.

BACKGROUND ART

In general, there are four main methods of measuring alternating voltages in high and medium voltage transmission and distribution systems, namely: magnetic methods in which potential transformers, for example, are used; methods utilising a potential divider or tap using impedances; optical methods utilising Pockels cells and liquid crystals etc; and mechanical methods utilising field mills, vibrating reeds etc. In addition, such methods can be combined to provide further methods of measuring high and medium alternating voltages.

Voltage measurements in high-voltage systems are traditionally made using potential transformers or capacitively-coupled potential transformers. These devices are both large and expensive, precluding their wide-spread use in many applications. In addition, as both these types of transformers require a direct connection to the high-voltage conductor, extensive safety precautions need to be put into place to ensure the necessary isolation requirements are provided.

Voltage dividers, either resistive or capacitive, are a second class of devices used when less measurement precision is acceptable. Resistive voltage dividers have the disadvantage that a galvanic connection to the high-voltage conductor is required. Capacitive voltage dividers can, however, be implemented so that the required isolation to the high-voltage is already provided by the existing installation.

Capacitive methods for measuring the potential on high-voltage cables are known.

In DE-A-3702735, a method is described for constructing a capacitive element and a capacitive voltage divider on a cable so that the line voltage at any location along a cable system can be measured. In this method, the dielectric strength of a high-voltage capacitor is determined by the conductor insulation of the cable itself, and, the voltage divider can subsequently be installed by applying specially shaped connecting sleeves or cable terminations at any point in a cable network to allow continuous voltage measurement at any number of test points in a cable network.

This method, however, has the disadvantage that the electric field within the cable may be perturbed by the added structures and its service life compromised due to the absence of semiconducting layers present in modern state of the art medium voltage cables. [By the term "semiconducting layer" is meant, as is well known in the art, a resistive material, typically, a carbon-laden polymer. In some cases, it may be a non-linear material whose resistivity decreases with increasing voltage.] Modern high-voltage cables use such layers to prevent electric field discontinuities in the cable and thus improve reliability and enable a thinner dielectric to be used. Furthermore, the method is based on a full capacitive divider, and, therefore provides a voltage based output. Moreover, such methods are extremely sensitive to moisture contamination, or any other effect that adds, even very small amounts, of conductivity to ground. This means that, even slight contamination, results in significant errors in any measurements taken. This makes the integrity of mechanical construction critical to maintain stability over the life of the device.

In U.S. Pat. No. 5,051,733, a method is described for constructing a capacitive element on an existing cable for sensing stray electric fields within the vicinity of a high voltage circuit. The capacitive element comprises the addition of a semiconducting layer and a contact layer to the semiconducting layer over an existing cable. The arrangement is used for high voltage circuits inside a mine power centre or switch house that are connected by means of individual insulated conductors. These insulated conductors are typically unshielded by any surrounding conductive layer, and, as a result, electric fields associated with high voltage energisation of the conductors extends beyond the cables themselves to other phase conductors and surrounding grounded surfaces within the power centre enclosure. Here, these stray electric fields are used to provide a visual indication that the high voltage conductors are energised. In effect, a capacitor is constructed around the insulated conductor and this provides a high impedance circuit through a gas discharge lamp to ground. The current through the capacitor is sufficient to cause the discharge tube to glow when the high voltage circuit is energised, thus providing a visible warning to maintenance personnel.

This method, however, has the disadvantage that the layers of semiconducting and contact materials need to be added to pre-existing cables. In addition, no grounded electrostatic screen is incorporated into the system. Due to this, interference will be present due to neighbouring equipment and/or other conductors. Moreover, the addition of layers can create issues with the accuracy and stability of the overall construction, making the long-term stability of the arrangement unpredictable. Furthermore, the arrangement described is intended for providing an indicating device not for voltage measurements.

U.S. Pat. No. 5,065,142 describes a method of constructing a capacitive element over an existing cable that is similar to that of U.S. Pat. No. 5,051,733. Flared sections of the conductor are provided to produce a gentle electric field distribution at the edges. A capacitor and a neon bulb or other gas discharge bulb characterised by avalanche breakdown at a predetermined voltage are connected in parallel with a rectifier. Optionally, a piezoelectric or other sound-generating device may be in series with the neon bulb. When the central conductor wire is energised at 1000 volts AC or above, the bulb flashes, and, the optional sound generator activates, both at a frequency dependent on the length of the external sheath along the insulation.

U.S. Pat. No. 4,241,373 describes a switchgear assembly which includes a vacuum interrupter, a current transformer, and a capacitive voltage sensor, all embedded within a cast epoxy housing mounted to a solidly grounded support structure. This has the disadvantage that it requires the unit to be manufactured as part of the cast body of the device, including a high-voltage conductor with its associated isolation, and a separate capacitive element cannot be implemented at a later date.

A circuit condition monitoring system for an electrical power distribution system is described in U.S. Pat. No.

4,794,331. The distribution system includes a connector component having an integrally formed test point which provides fault current or voltage loss monitoring of a conductor within the connector component. The connector component includes a circuit monitoring module that can be capacitively coupled to the system conductor and to the module to function as a test point for providing operating power to the module. A sensing plate is embedded in the connector body to provide the capacitive coupling. This arrangement, however, has the disadvantage that its implementation in an existing installation requires the replacement or addition of cable connectors and sockets.

An indicator device that indicates a circuit condition is described in U.S. Pat. No. 4,794,329. The indicator device detects the occurrence of a fault current in a high voltage conductor from which the indicator device is suspended. The device includes a housing having at the upper end thereof a pair of outwardly projecting cable engagement members. The engagement members are formed of a resilient insulating material and each includes an outwardly projecting base portion and an inwardly projecting end portion which engages and holds the cable against the rear wall of the housing. Operating power for the indicator device is derived from the potential gradient of the electric field surrounding the conductor by means of a metallic plate positioned within the housing adjacent the conductor, and a metallic ring and electrically conductive coating within the lower end of the housing.

In this arrangement, the mechanical stability is limited and no electrostatic screening is provided, thus interference and proximity effects with neighbouring structures will be significant. The device is not used for determining measurements but purely for providing indication of the presence of a fault current in the high voltage conductor on which it is mounted.

In U.S. Pat. No. 3,538,440, a method is described for constructing a capacitive element inside an existing cable which comprises an electrode placed below the surface level of the cable dielectric. This has the disadvantage that the cable dielectric must be compromised during the addition of the capacitive element. In many cases, the cable dielectric is already thin, limiting the applicability to certain cases where such a disturbance in the dielectric can safely be made. Essentially, the method relates to a means of keeping the output voltage constant, which is undesirable for a measuring device.

A high voltage measuring device is described in U.S. Pat. No. 4,121,154 that is used to measure the amount of voltage in an alternating current carrying line. The measuring device uses a capacitive element with an associated amplifier which, in use, is brought near to the high voltage line. A voltage output is provided which is derived from a dc signal that has been converted from an ac signal. However, this device is not suitable for use with many cable installations and its accuracy depends strongly on environmental factors disturbing the electrical field that is sensed by the device.

In U.S. Pat. No. 4,052,665, a method is described for constructing a capacitive element on an existing cable which comprises of concentric electrodes clamped around the cable. A capacitive pickup device is clamped to an insulated conductor and a measurable voltage is derived which is a linear function of the magnitude of pulsating high voltage in the conductor, the high voltage being of the order of 15 to 40 kilovolts such as encountered in ignition systems of internal combustion engines.

This method, however, has the disadvantage that the clamp does not manage the electric field at its edges and may cause dielectric integrity problems over time when the device is permanently connected to the insulated conductor.

Known capacitive voltage measurement methods fail in practice due to two factors. On one hand, voltage divider-based capacitive methods are highly susceptible to contamination, and on the other hand, modern cables use thin dielectrics and rely on field gradient control to keep the internal electric fields free from discontinuities and prevent breakdown of the dielectric.

DISCLOSURE OF THE INVENTION

It is therefore an object of the present invention to provide a high voltage measurement system that utilises the entire electrical cable on which measurements are to be made as part of the measurement system and with which more accurate measurements can be obtained.

This object is achieved with a high voltage measurement system showing the technical characteristics of the first claim.

In accordance with the present invention, there is provided a measurement apparatus for measuring the voltage of an insulated electrical cable including at least one central conductor, a first dielectric layer surrounding the at least one central conductor, a semiconducting layer surrounding the first dielectric layer and a cable shield surrounding the semiconducting layer. The apparatus comprises a sensing electrode assembly arranged around the cable, comprising a sensing electrode element connected to the semiconductor layer, such that a sensing capacitor is formed by the semiconductor layer together with the at least one central conductor and at least the first dielectric layer of the insulated electrical cable. An electrical circuit is connected to the sensing electrode element. The apparatus further comprises an arrangement for defining the effective sensing area of the sensing electrode assembly. The electrical circuit comprises a current-mode signal conditioning circuit, an input of the current-mode signal conditioning circuit being connected to the sensing electrode element and being referenced to a circuit reference potential of the current-mode signal conditioning circuit, to which the cable shield is connected, the current-mode signal conditioning circuit being arranged for compensating parasitic impedances of the semiconductor layer by actively driving its input impedance towards zero.

The present invention is based on a capacitive coupling using the existing structure of a high or medium voltage cable as a significant portion of the coupling capacitor of the sensor unit that is used for measurement of the voltage on the insulated electrical cable. Due to the use of capacitive coupling, no galvanic contact is required with the electrical conductor. In accordance with the present invention, the cable construction is used to advantage, especially with regards to the intrinsic dimensional and mechanical stability of a given section of cable and its associated elements.

Ideally, the existing semiconducting layer can be used to smooth the electric field and this eliminates the mechanical complications of having to flare the edges of the electrodes to provide electric field uniformity.

In the measurement apparatus of the present invention, the high-voltage cable itself is utilised as part of the measurement apparatus as it already provides the conductor and associated isolation. The sensor, in the form of an electrode assembly, is built on top of these pre-existing structures and therefore does not require an additional high-voltage isolating body. As such, no additional high-voltage connections need be made to a separate unit incorporating the sensor, nor is there a need to interact with the high-voltage conductor itself. Further, disturbance of the electric fields within the cable can be avoided or minimized, since the semiconductor layer can remain intact.

In contrast to some prior art measurement apparatus, the measurement apparatus of the present invention forms a fixed construction on the cable and therefore overcomes any problems associated with mechanical stability of temporary connections made to enable the voltage measurement to be obtained.

The current-mode signal conditioning circuit as used according to the present invention takes an input current from the sensing electrode element and presents a near-ideal, zero ohms input impedance to said element with respect to an advantageously chosen reference potential, typically the grounded cable shield. This condition is attained by actively driving the input potential difference with respect to the reference potential, to zero or near zero potential. The use of this referenced current-input signal conditioning, in conjunction with the sensor, enables measurement errors due to the high conductivity of the semiconducting layer itself, dirt, moisture contamination, aging of the semiconducting layer, and thermal-induced conductivity changes in the semiconducting layer to be significantly reduced, and thereby a possible simplification of the mechanical construction of the sensor.

A second dielectric layer is preferably placed over at least the electrode element. In addition, an electrostatic shield is preferably placed over the second dielectric layer.

In one embodiment, the electrostatic shield is connected to a shield on the insulated electrical cable. This can provide grounding of the electrostatic shield.

In another embodiment, the electrostatic shield comprises a shield on the insulated electrical cable and which extends over the electrical cable and the second dielectric layer covering at least the electrode element. The electrostatic shield may comprise the shield of the electrical cable.

By using a screened cable as a basis, the semiconducting layer is close to ground potential. This can increase the electrical safety of the system and the survivability of the electronics in case of a large system transient, and also reduces interference from the environment.

In an embodiment, the arrangement for defining the effective sensing area of the sensing electrode assembly comprises first and second additional electrode elements that are positioned either side of the electrode element. This improves the definition of the electrical geometry of the sensing electrode element, and thereby more accurately defines the effective sensing area.

In an alternative embodiment, the arrangement for defining the effective sensing area of the sensing electrode assembly comprises first and second clamping devices around edge portions of the cable shield on either side of the sensing electrode element.

For temperature compensation, a suitable circuit element, for example an integrating capacitor, associated with the signal conditioning circuit thermally joined with the sensing electrode element may be utilised for current-mode operation. In addition, a temperature sensor associated with the electrode element may be used alone or in conjunction with the thermally-joined circuit element.

Advantageously, connections to the electrode elements of the measurement apparatus of the present invention may be made by a multi-axial conductor.

The present invention and preferred embodiments thereof may offer one or more of the following advantages over known measurement systems:

1. The use of ground-referenced current-input signal conditioning, in conjunction with the sensor, enables measurement errors due to the high conductivity of the semiconducting layer itself, dirt, moisture contamination, aging of the semiconducting layer, parasitic capacitances between the sensor element and other structures, and thermal-induced conductivity changes in the semiconducting layer to be significantly reduced, thereby simplifying the mechanical construction of the sensor.

2. Correction techniques for thermally-induced variations in the sensor geometry, and thus thermally-induced measurement errors, may be easily implemented by means of a suitable circuit element, e.g. a thermally joined integrating capacitor. These techniques can significantly improve the accuracy of the device over varying operating conditions.

3. The electrical geometry of the sensing electrode element can be defined easily and exactly by means of additional electrode elements on either side of the sensing electrode element.

4. The sensor makes optimal use of the construction of a state of the art high-voltage cable. The cable isolation is used as the primary dielectric of the coupling capacitor, and therefore, the critical high-voltage isolation of the sensor can be obtained automatically.

5. The semiconducting layer present on the cable is used to ensure mechanical stability of the second capacitor electrode, and can facilitate over-voltage protection during system transients by providing an impedance to the grounded shield of the cable.

6. The presence of the semiconducting layer allows the use of simple, thin, sharp-edged electrodes. Without such a layer, the electrode edges need to be flared or other measures have to be taken to insure smooth electric field gradients. By preserving this layer, the electric field in the cable can be left mainly unperturbed, reducing the risk of dielectric failure due to sharp field gradients due to the added electrode edges.

7. As the present invention uses existing structures which are critical for the stability of the measurement, the installation of the sensor can be greatly simplified.

8. By applying an electrostatic shield over the construction which extends beyond the sensing element and contacts to both the cable shield and the semiconducting layer at both extremities of the sensing element, electrical interference and proximity effects due to other cables, equipment, and structures can be strongly reduced and/or avoided.

BRIEF DESCRIPTION OF THE DRAWINGS

For a better understanding of the present invention, reference will now be made, by way of example only, to the accompanying drawings in which:—

MODES FOR CARRYING OUT THE INVENTION

Figure 1:
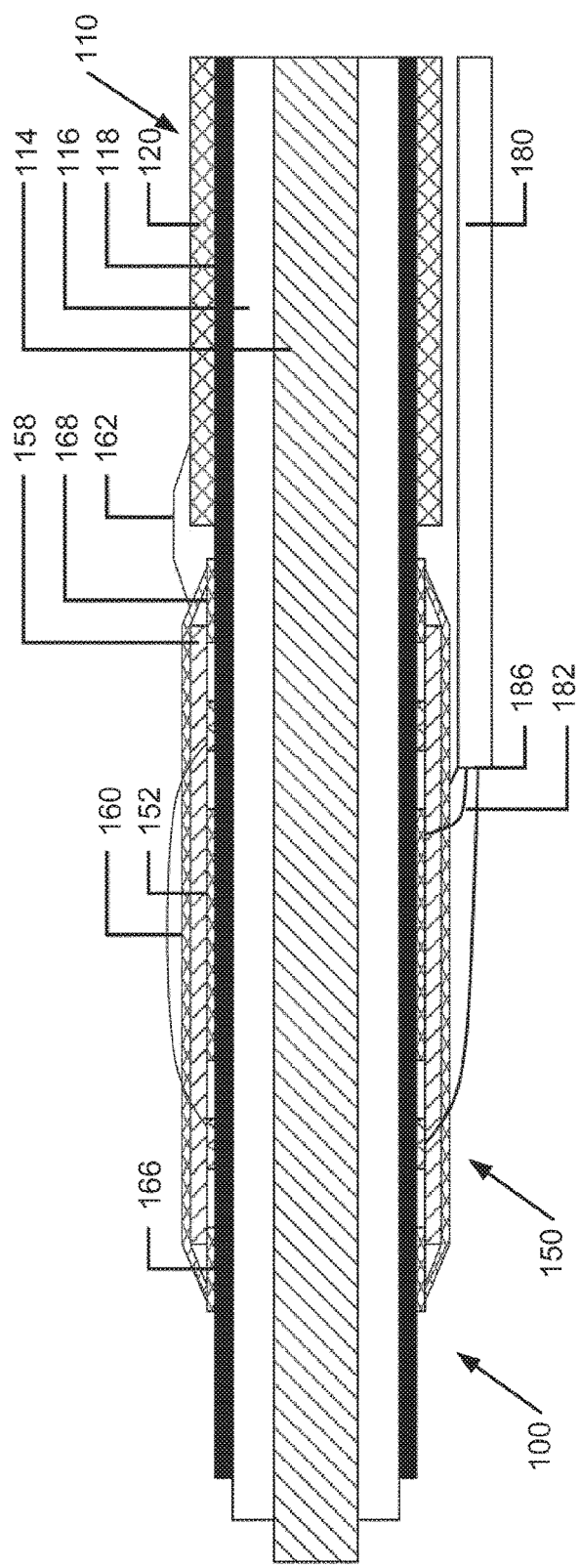
FIG. 1 is a schematic sectioned illustration of a sensor in accordance with the present invention that is constructed at the end of a cable section.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

Furthermore, the various embodiments, although referred to as "preferred" are to be construed as exemplary manners in which the invention may be implemented rather than as limiting the scope of the invention.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present invention, the only enumerated components of the device are A and B, and further the claim should be interpreted as including equivalents of those components.

The sensing device in accordance with the present invention uses pre-existing cable structures present in many modern high-voltage cables to implement the first part of a coupling capacitor to the high-voltage conductor. The cable centre conductor forms the first capacitor plate, the cable dielectric forms the capacitor dielectric, and the cable semi-conducting layer forms the second capacitor plate. This second plate performance may be improved by applying a metallic, or other better conductor than the semiconducting layer, to the material. A connection is made to this second plate. By using the existing cable dielectric, the expensive and safety critical part of such an assembly, namely, the high-voltage isolation, is automatically provided.

The capacitor as described above is covered with a dielectric layer and then an electrostatic shield over the top of the dielectric layer to prevent environmental influences, such as, proximity effects and electrical interference due to other equipment and current-carrying conductor in the vicinity from degrading the measurement. Preferably, the electrostatic shield comprises a metallic conductor which is attached to the semiconducting layer at both sides of the capacitor section. The electrostatic shield can also be connected to the cable shield which is grounded. In an embodiment where the capacitor electrode is enhanced with a metallic section, the shield attachment is spaced some distance from the edges of the metallic section to prevent a short circuit of the shield to the second capacitor plate either directly or through a too short section of the semiconducting layer. Alternatively, the cable shield can be used in the same manner as the electrostatic shield.

The electrostatic shield may form a second parasitic capacitor where the first plate comprises the semiconducting layer with or without the additional conductor, and the second plate comprises the grounded electrostatic shield. The dielectric, in this embodiment, comprises the applied dielectric layer. It is to be noted that this capacitor is in parallel with the impedance of those sections of the semi-conducting layer which run from the attachment points of the electrostatic shield to this semiconducting layer and the ends of the metallic conductor applied to the semiconducting layer or the attachment point to the semiconducting layer.

In the construction of the sensor, the effective capacitor size extends beyond the length of the sensing electrode element when a semiconducting layer is present. This effective size is a function of the properties of the semiconducting layer, and how and where it makes electrical contact with the cable shield (reference potential). The effective size of the resulting capacitor may optionally be better defined in several manners, much improving the resulting accuracy and stability of the measurement, herein generally referred to as arrangements for defining the effective sensing area of the sensing electrode assembly.

One proposed method is by interrupting the semi-conducting layer on either side of the sensing element over a short distance. Doing so, the total mechanical length of the sensing element plus the stretch of semi-conducting layer on each end of the sensing element up to the respective gap equals the electrical length of the sensing element. Since interrupting the semiconducting layer disturbs the electric field inside the cable, the resulting gaps may be re-filled with a non-linear, resistive material that maintains a high resistivity over normal operating voltages and reverts to a low-resistivity during over-voltage conditions. Thus, the integrity of the internal cable field distribution may be maintained during abnormal operating conditions, at the expense of sensor accuracy during these conditions.

Other methods are based on providing two additional electrodes on either side of the sensing electrode, both of which are electrically connected to the reference potential, typically the cable shield and/or the electrostatic shield.

These are preferred embodiments of the sensor. The effective capacitor size is then defined by the metallic portion of the capacitor section and half the distance, at both sides, between this metallic portion and the edges of the metallic contacts or the ground connection to the semiconducting layer. Such electrodes can be applied directly on top of the semiconducting layer. Alternatively, the cable shield or electrostatic shield can be clamped to make direct electrical contact with the semiconducting layer, providing similar functionality.

It may be readily appreciated that any electrode discussed in this text, although generally described as metallic, may be manufactured from many different types of highly conductive substances, such as metals and specially prepared polymers.

Due to the sensor in accordance with the present invention being constructed on top of the semiconducting layer of the cable, the electric field inside the cable is virtually unaffected. The semiconductor layer can remain undamaged on the side facing the high-voltage conductor. This, together with the possible continuity of the cable shield over the structure due to the possible electrostatic shield in the sensor, effectively ensures that there is no impact on the functionality of the cable itself. This is important as discontinuities in the structures surrounding the cable dielectric may cause strong localised electric fields which may degrade the dielectric and cause damage and flash-over, over time.

Another benefit of the sensor construction in accordance with the present invention is that pre-existing cable structures are used extensively for the construction of the most critical coupling capacitor elements of the sensor arrangement. These structures are moulded around the conductor and one another, resulting in a mechanically stable and resilient whole. By not tampering with this whole, the critical spacing between the capacitor plates of the sensing capacitor is well controlled and mechanically stable. Furthermore, this greatly reduces installation time of the sensor and also chance for error and degradation over time due to loosening adhesives, environmental contamination, or improper installation. The latter, especially, may cause issues due to electric field gradients and potential resulting dielectric degradation.

The result of the construction is a well-defined, small-value coupling capacitor to the high-voltage conductor. This capacitor may now be used in conjunction with a wide variety of circuits to obtain a measurement of the potential on the high-voltage conductor. The preferred embodiment, however, would be a ground-referenced current-input signal conditioning device, that may be used in conjunction with a current divider or not, so that the second plate of the coupling capacitor may be kept very close to or at ground potential during normal operation, and the loading created by the impedance of the semiconducting layer and the second capacitor may be made negligible. The impedance of the semiconducting layer and the second capacitor are not well defined and care is needed to ensure they remain constant over time. By using the current-based method, these factors become negligible for the measurement. However, these parasitic components offer some advantage as they divert transient effects and static build-ups.

Temperature correction techniques may also be added, either through direct measurement of the sensor temperature and correcting in the signal conditioning, or adding a temperature-dependent element that corrects the deviation in the signal conditioning. One implementation of the latter approach may be accomplished by integrating the integration capacitor required in some forms of signal conditioning circuits in the sensor so it is thermally joined with the sensor. By choosing a suitable type, or combination of types, its thermal dependence can be chosen to compensate for the thermally-induced changes in the coupling capacitance. The suitability of this will depend on the signal conditioning used. Both methods can be used separately or in conjunction with one another, depending on the desired required performance.

In the description below, the term "co-axial" refers to a cable where a continuous shield is present co-axially with a conductor, the shield and the conductor being separated by an isolator.

As mentioned above, the term "semiconducting layer" refers to a resistive material, typically, a carbon-laden polymer, or to a non-linear resistive material whose resistivity decreases with increased applied voltage. Modern high-voltage cables use such layers to prevent electric field discontinuities in the cable. This improves reliability and a thinner dielectric layer can be used.

In the detailed description of the drawings that follow, elements that are the same in each of the Figures are reference the same.

The present invention relates to constructing a coupling capacitor on a medium- or high-voltage cable. When constructing such a coupling capacitor, a short length of the cable can be used. For example, a length in the range of 1 cm to 5 cm could be used due to space constraints. The constructed capacitor is effectively a co-axial capacitor where the central conductor of the cable forms an inner cylinder and an added electrode forms an outer cylinder. The dielectric of the constructed capacitor is formed by components of the cable between the two cylinders. In practical cables, the dielectric has a relative permittivity of between 2 and 3 and with a spacing between the cylinders of between 0.5 cm and 1 cm, a coupling capacitor having a capacitance between 5 pF and 20 pF can be provided. Typically, a capacitance of around 15 pF can be obtained for cross-linked polyethylene (XLPE) cables that are rated up to 15 kV. However, regardless of the precise value of this capacitance, it is very small compared with the parasitic effects encountered when constructing the sensor for use with a grid fundamental of 50 Hz and the underlying issue can be reduced to that of relative impedances, that is, the impedance of the coupling capacitor at 50 Hz relative to the impedance of parasitic elements in the construction. An example of a constructed coupling capacitor is shown in FIG. 1.

The impedance at 50 Hz for a capacitance of 15 pF can be determined using the formula:

$$Z = \frac{1}{j\omega C_{coupling}}$$

Here, Z is the impedance, ω is the frequency and $C_{coupling}$ is the capacitance. For the values given above, Z is 212 MΩ. This is an extremely high impedance, comparable to contamination effects such as, finger prints on the dielectric, small amounts of moisture and air humidity, imperfections in the sensor construction and its dielectrics, parasitic capacitances due to wiring and from the electrode to the cable shield etc.

It will be appreciated that the issue is not that the parasitic impedances are present, as they can be corrected in signal conditioning, but that many are both unknown and time variant. This means that if a circuit were to be calibrated for the parasitic impedances, the calibration would not remain accurate over time.

It must be noted that the majority of these parasitic impedances are located between the applied electrode and ground. The only parasitic of practical importance between the applied electrode and the cable centre conductor is the conductivity of the dielectric. This is typically in the order of hundreds to thousands of GΩ, for modern polymer dielectrics such as XLPE, and thus easily three orders of magnitude larger then the impedance of the coupling capacitance for the grid fundamental. Modern materials also have extremely low to practically non-existent moisture absorption that degrade their insulating properties. The dielectric conductivity can thus be ignored in most practical situations.

The thermal stability of the constructed coupling capacitor needs to be such that it follows faithfully the thermally-induced changes in geometry and dielectric constant of the capacitor dielectric so that thermal correction can be used in the signal processing. This can take the form of suitably chosen components in the signal processing circuit that, when thermally coupled with the sensor environment, compensate for deviations. Alternatively, the temperature of the system can be monitored and used for corrections. The influence of thermally-induced geometry changes on the sensor is relatively small and they can be estimated using the following assumptions: the geometry change is mainly induced by the major structures, the cable centre conductor (taken to be aluminium); the dielectric (taken to be XLPE); and the coupling capacitor electrode (taken to be copper). The expansions of interest are those radial and axial to the cable length. Their combined influence on the coupling capacitor can be expressed as a function of ambient temperature. Typical values of linear expansion coefficients for the materials used at 25° C. are: for elemental aluminium, 23.1 μm$^{-1}$K$^{-1}$; for elemental copper, 16.51 μm$^{-1}$K$^{-1}$; and for XLPE, 2001 μm$^{-1}$K$^{-1}$.

The equation that governs the capacitance of a co-axial capacitor structure is given by:

$$C = \frac{2\pi\varepsilon_0\varepsilon_r}{\ln\left(\frac{B}{A}\right)} L$$

Here, L is the length of the structure in meters, A the outer diameter of the centre conductor in meters, B the inner diameter of the outer electrode in meters, and $\in_r$ the relative permittivity of the dielectric. For cross-linked polyethylene, $\in_r$=2.2 and $\in_0$=8.8542×10$^{-12}$ Fm$^{-1}$, the permittivity of vacuum.

A simple approximate expression for the temperature dependency of the coupling capacitance can be obtained assuming the material properties remain constant over this temperature range. The first is the axial component, given by L above. Here, the only part that must be investigated is the axial length of the copper cylinder that is applied to the cable, as the cable passing through it may be considered to be infinitely long:—

$$L_{\Delta t} = L(\sigma_s\Delta t+1)$$

Here, L is the length of the sensor element, Δt is the change in temperature in degrees, and $\sigma_s$ is the thermal expansion coefficient in m m$^{-1}$K$^1$ of the sensor element. The result is $L_{\Delta t}$, the effective length of the element in meters with the temperature effects included.

Over a ±25° C. temperature variation, typical for a distribution sub-station where a range of 50° C. around the temperature average is expected, and a copper sensor element of length 5 cm, a change in axial length (and thus capacitance) of 0.04% is obtained.

The second part of the derivation is the radial component, given by the ratio of A and B, where A is the outer diameter of the centre conductor in meters, B is the inner diameter of the outer electrode in meters, Δt is the change in temperature in degrees, and $\sigma_c$ and $\sigma_d$ are the thermal expansion coefficient in m m$^{-1}$K$^{-1}$ of the centre conductor and dielectric respectively. The resulting new ratio $$\left(\frac{B}{A}\right)_{\Delta t}$$

has the temperature effects included where $$\left(\frac{B}{A}\right)_{\Delta t} = \left(\frac{B}{A}\right)\left(\frac{\sigma_d\Delta t+1}{\sigma_c\Delta t+1}\right)$$

Combining the two parts in the equation for the capacitance above provides a basic expression for value of the coupling capacitor, when exposed to the desired temperature variation:

$$C_{\Delta t} = \frac{2\pi\varepsilon_0\varepsilon_r}{\ln\left(\frac{B}{A}\frac{\sigma_d\Delta t+1}{\sigma_c\Delta t+1}\right)} L(\sigma_s\Delta t+1)$$

From this, a variation in capacitance over the same ±25° C. degree temperature variation around the average, 50° C. in total, compared to the capacitance without temperature compensation, for a typical medium-voltage cable where A=18 mm and B=28 mm and a sensor element length of 5 cm, of 0.95%.

This variation is over a temperature range of ±25° C. is thus ±1% and is acceptable for many applications.

The thermally-induced change in dielectric constant of the cable isolation is, typically, of much greater importance than the geometry variation. However, this influence is well-known for typical cable dielectrics and can be readily compensated for in the already mentioned manners.

The semiconducting layer has a high conductivity, typically a value of 1 kΩcm$^{-1}$ or less is obtained for a modern cable. The layer is also extremely temperature-dependent and may have a linear or non-linear dependence on the cable voltage, making it a significant unknown in the sensor construction.

As this layer is effectively left unperturbed to guarantee the continuity of the electric field inside the cable, and building the coupling capacitor electrode on top of it, the layer, which is connected to the cable shield, and thus ground, essentially presents a near-short to the 212 MΩ impedance of the coupling capacitor for the grid fundamental. This, in itself, would not be a problem if the resistance of the semiconducting layer is well-defined and stable. It would then simply be part of the current divider needed in the sensor. By using a ground-referenced, current-mode signal conditioning circuit, as described below, these issues are resolved.

In accordance with the present invention, a capacitor is constructed on a cable using the dielectric of the cable itself. The constructed capacitor may also be used as a current-limiting impedance to ground. This current, after integration, becomes a measure for the voltage on the cable conductor. The integrating capacitor may now be chosen to match the temperature dependence of the coupling capacitor to correct for its thermal dependence. This requires a thermal link between these capacitances and the coupling capacitor. Other methods may use a measurement of the sensor temperature and correct the thermal errors indirectly.

Figure 2:
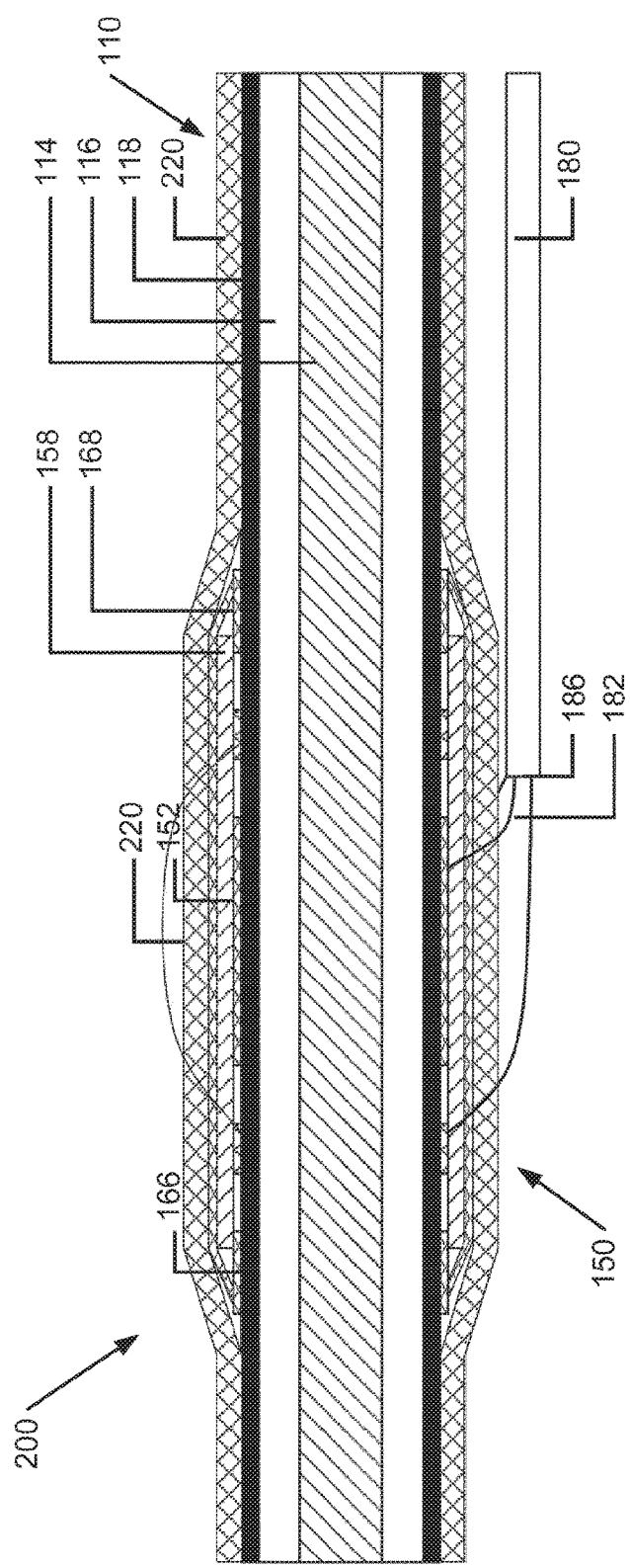
FIG. 2 is a schematic sectioned illustration of a sensor in accordance with the present invention that is constructed along a cable section.

In FIGS. 1 and 2, the construction of the device in accordance with the present invention is shown. The difference between both figures is the location of the sensor construction. In FIG. 1, the construction is near the end and thus the cable shield needs to be terminated. In FIG. 2, the device is constructed along a length of cable, and thus requires the cable shield to be continuous over it.

In FIG. 1, a sensor arrangement 100 is shown where a sensor 150 is located at one end of a high-voltage cable 110. The cable 110 comprises a central cable conductor 114 that is covered by dielectric layer 116. Over the dielectric layer 116 is a semiconducting layer 118. At the end, a cable shield 120 is also provided over the semiconducting layer 118. The sensor 150 comprises a sensing electrode 152 positioned on the semiconducting layer 118, a dielectric layer 158 and an electrostatic shield 160. The electrostatic shield 160 is connected to the cable shield 120 by way of an electrical connection 162.

It will be appreciated that the electrostatic shield 160 may comprise a continuation of cable shield 120, and, in that case, the electrical connection 162 will not be needed.

Optional conductor electrodes 166, 168 may also be provided. In this case, the conductor electrodes 166, 168 are located on respective sides of the sensing electrode 152. These electrodes 166, 168 are used to improve the definition of the sensing electrode 152 to ground resistance of the electrostatic shield 160, and are electrically connected with the electrostatic shield 160.

The sensor arrangement 100 includes a co-axial conductor 180 that provides electrical connections to the sensing electrode 152, shown by connection 182, and to the electrostatic shield 160, shown by connection 186.

In the simplest embodiment of the present invention, the sensing electrode 152 is not needed. In this embodiment, the central conductor 114 of the cable 110 forms a first capacitor plate, the dielectric 116 of the cable 110 forms a capacitor dielectric, and the semiconducting layer 118 of the cable 110 forms a second capacitor plate. Electrical connection is made to the semiconducting layer 118 (not shown) at a position that is equidistant between the positions of the optional conductor electrodes 166, 168. However, the use of the sensing electrode 152 improves the performance of the sensor 150.

It will readily be appreciated that, as the cable 110 is cylindrical having a circular cross-section, the electrodes 152, 166 and 168 and the electrostatic shield 160 are preferably implemented as cylinders. However, other shapes can be used but may result in degradation in the performance of the sensor 150.

The dielectric layer 158 preferably overlaps to some extent with the optional electrodes 166, 168 to ensure that sections of semiconductor layer 118 between those electrodes and the sensing electrode 152 are properly isolated from the electrostatic shield 160.

Turning now to FIG. 2, a sensor arrangement 200 is shown which is located along a section of cable 110. Both the cable 110 and the sensor 150 are as described with reference to FIG. 1, but in this case, the sensor 150 is located underneath the cable shield 220 so that a continuous cable shield 220 can be provided. Electrical connections are made as described with reference to FIG. 1. Such a sensor arrangement 200 is of use where a measurement point is to be inserted along a length of shield high-voltage cable.

Figure 3:
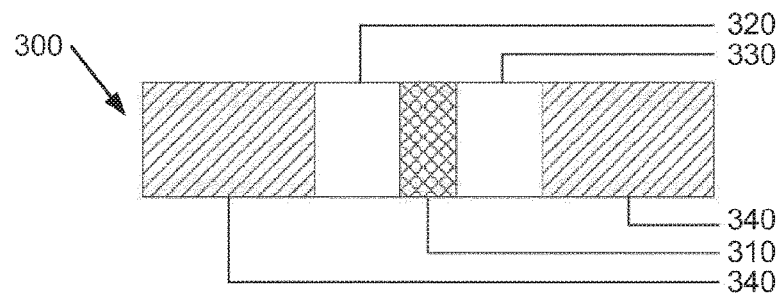
FIG. 3 is a schematic illustration of a first sensor electrode configuration.

In FIG. 3, a simplified sensor electrode arrangement 300 is shown. The arrangement 300 comprises a sensing electrode 310 that covers a section of semiconducting layer leaving two portions 320, 330 of the semiconducting layer 118 exposed. Cable shield 340 is provided around the semiconducting layers 320, 330 remote from the sensing electrode 310. The cable shield 340 is grounded.

Figure 4:
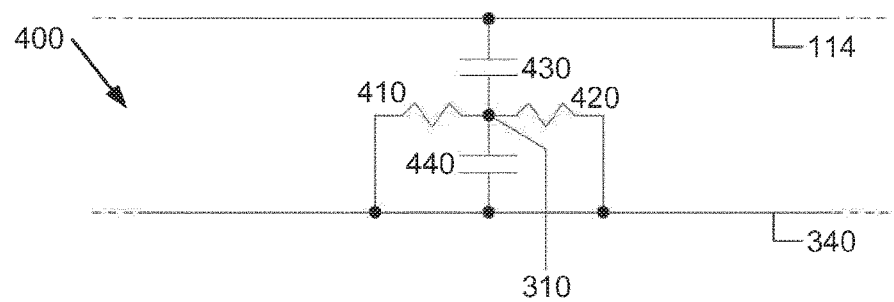
FIG. 4 is a circuit diagram corresponding to the first sensor electrode configuration of FIG. 3.

FIG. 4 illustrates an equivalent circuit 400 of the sensor electrode arrangement 300 shown in FIG. 3 from central conductor 114 of the cable 110 to cable shield 340. Resistors 410, 420 represent respective sections of semiconducting layers 320, 330 between the sensing electrode 310 and the cable shield 340. Capacitor 430 represents the main sensing capacitor formed between the central conductor 114 (FIGS. 1 and 2) of the high-voltage cable 110 and the sensing electrode 310, and capacitor 440 represents a parasitic capacitor between the sensing electrode 310 and the cable shield 340.

The only necessary element is the capacitor 430 connected to the cable conductor 114. This is the capacitor that is constructed on the cable dielectric through the addition of a sensing electrode. However, this electrode is constructed on top of the semiconducting layer, which is connected to the cable shield. This length of semiconducting layer is modelled by resistors 410 and 420 that are connected to ground via the cable shield 340. As described above, the semiconducting layer is highly sensitive to temperature and its conductivity varies widely over the nominal operating range of the sensor device. Furthermore, contamination of the construction will add further unknown variability to resistors 410, 420. In practice, resistors 410, 420 have low resistance values, typically a few hundred ohms. The impedance of the coupling capacitor 430 is many orders of magnitude higher for the grid fundamental. Clearly, the variable and unknown loading by the parasitic impedances on resistors 410, 420 greatly compromises the accuracy of the whole sensor device.

Capacitor 440 connected between the sensing electrode 310 and the cable shield 340 is dependent on the construction and not nearly as well defined as capacitor 430. Capacitor 430 has, by virtue of the close union between the cable dielectric 116, the central conductor 114, and the semiconducting layer 118, a well-defined and rigid geometry. Since the materials used have low temperature coefficients, capacitor 430 is stable and well defined.

Figure 5:
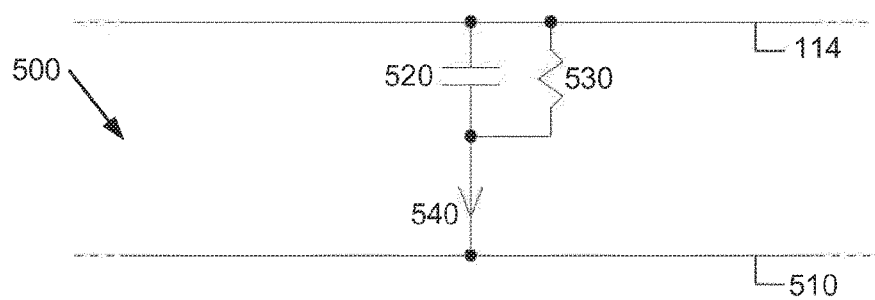
FIG. 5 is a simplified circuit diagram of a sensor when a ground-referenced current-mode conditioning unit is used.

The influence of resistors 410, 420 and capacitor 440 must be compensated for in order to obtain an accurate measurement. In FIG. 5, a simplified version 500 of FIG. 4 is shown for use with a ground-referenced current-mode signal conditioning unit. Here, the signal conditioning presents a near perfect short circuit to ground that shunts the majority of the parasitic capacitances. The central conductor 114 of the cable 110 and a grounded cable shield 510 is shown. Capacitor 520 represents a sensing capacitor that is connected between the conductor 114 and the sensing electrode (not shown). Resistor 530 represents leakage current due to the dielectric layer 116 of the cable 110. A current output 540 is shown that represents the output from the sensor and must be integrated by a signal conditioning unit (not shown) to obtain the voltage of the cable 110.

In FIG. 5, resistor 530 represents parasitic impedances that have not previously been described and are generally negligible. Effectively, resistor 530 relates to the conductivity of the dielectric layer 116 of the cable 110 itself. However, the main method that reduces the circuit to its shown simplicity is one of guarding, an implicit guard in this case. If the output of the sensor were to be shorted to ground and one could measure the current in this connection without causing a significant voltage rise, the parasitic components that mar the system will no longer have any potential over them, and their effect is therefore effectively removed from the sensor response.

Figure 6:
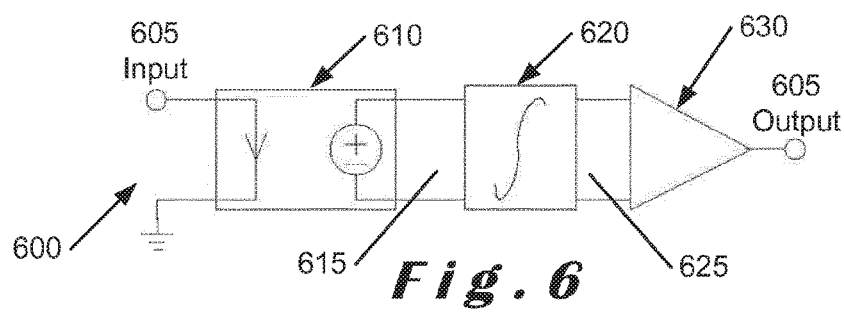
FIG. 6 is a schematic illustration of a ground-referenced current-mode signal conditioning unit.

In practice, such a circuit can be built using a charge amplifier. This also provides an integration function that is required to compensate for the differential behaviour of the device due to the coupling capacitor used in a current mode. When the integrating capacitor is well-chosen and thermally linked with the sensor coupling capacitor, an automatic correction for temperature dependence is readily obtained. Regardless of the practical implementation, a ground-referenced current-input circuit is required to offer a way to measure the cable voltage without inducing a potential between the measurement point and the cable shield, which is grounded. This is shown in FIG. 6 where the basic principle is shown in and described with reference to FIG. 14 below. As long as a near-zero voltage drop over the signal conditioning unit is maintained, the simplification of FIG. 5 is valid.

FIG. 6 illustrates a ground-referenced current-mode signal conditioning unit 600. The unit 600 comprises a current-to-voltage converter 610, an integrator 620 and a gain stage 630. Although these elements are described separately, it will be appreciated that these units may be combined as a single element. Input 605 is provided for the converter 610 which provides an output voltage signal 615 that is input to the integrator 620. It will be understood that the converter 610 may also have a current output. An integrated output 625 is provided to the gain stage 630, which in turn, provides an output 635.

It is important that the voltage drop over the input 605 remains as close as possible to zero so as to maintain the short-circuit assumption required to cancel the sensor parasitic capacitances. Furthermore, the accuracy and drift of the integrator 620 are critical to the overall accuracy. Digital processing may thus be beneficial over analogue processing.

Temperature compensation can also be readily added to the sensor, as the dependencies on temperature, through the use of guarding, are reduced due to the change in capacitance of the coupling capacitor. More significantly, and much harder to accurately and generally correct for, changes in the parasitic components are effectively removed from the sensor response.

Temperature compensation can be accomplished in many ways. However, two eminently practical methods may be readily used with the sensor, shown in FIG. 7. First, one could simply measure the temperature of the device and, since most parasitic components but the actual sensor itself are compensated for, one would only need to correct the reading in the signal processing from the temperature measurement. A second more elegant and economical method is to place a thermally variable component of the signal processing circuit in the sensor so it may share the structural temperature of the sensor and a correction can be achieved.

When a charge amplifier is used, the choice of the temperature compensation component is clear. The integration capacitor, which directly sets the division ratio of the sensor, can be chosen with a suitable thermal characteristic so its value deviates by the same percentage as the capacitor constructed on the cable. Thus, their ratio remains the same and the sensor is effectively temperature-compensated.

Figure 7:
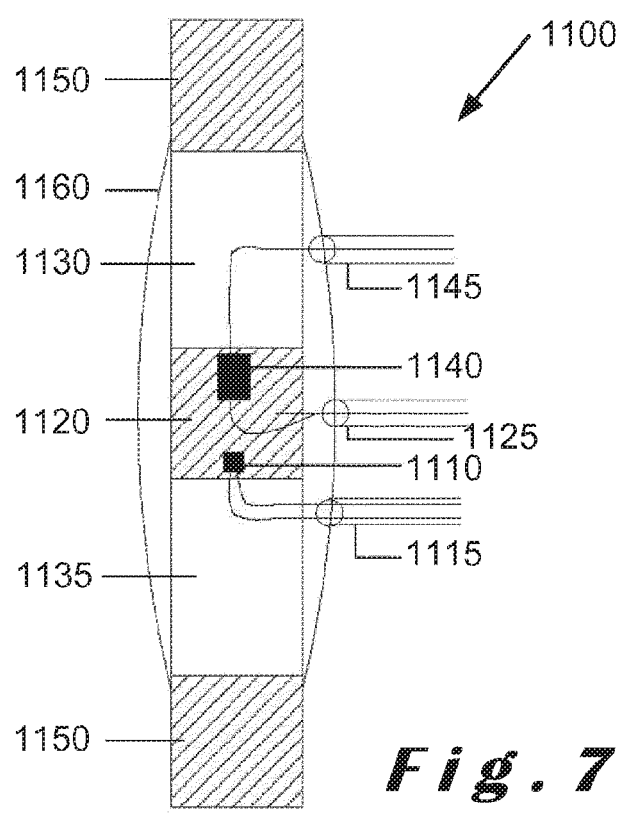
FIG. 7 is a schematic illustration of temperature compensation for current-mode operation.

In FIG. 7, a sensor arrangement 1100 having two temperature compensation schemes for current-mode operation is shown. The two compensation schemes comprise a temperature sensor and an integrating capacitor which may be used together or separately. A temperature sensor 1110 is provided, the output of which can be used in signal processing to correct for temperature-related errors. The temperature sensor 1110 is located within a sensor coupling electrode 1120. The electrode 1120 is located between two regions 1130, 1135 of a semiconducting layer. The electrode 1120 comprises an integrating capacitor 1140 that is used in conjunction with a charge amplifier in a signal conditioning unit to convert the sensor output into a usable signal. By thermally joining the capacitor 1140 with the sensor coupling capacitor electrode 1120, and making a careful choice in its type, temperature-related errors may be corrected. In practice, either or both may be used.

A shielded connection 1145 is provided to the capacitor 1140 and a shielded connection 1115 is provided to the temperature sensor 1110. A shielded connection 1125 is also provided to the sensor electrode 1120. When the integrating capacitor 1140 is utilised, the shielded connection 1125 to the sensor electrode 1120 is also electrically joined with the integrating capacitor 1140. In practice, all three shielded connections 1115, 1125, 1145 may be joined in a single shielded cable assembly, for example, a tri-axial or co-axial cable if only one of the temperature sensor or integrating capacitor is provided, in which each of these electrical connections are shielded from the others. However, it will be appreciated that in FIG. 7, these shielded connections are shown separately for clarity and ease of explanation. A grounded shield 1150 of an existing cable (not shown) and an applied shield 1160 are also shown in FIG. 7. The applied shield 1160 is applied over the sensor arrangement 1100 with isolation between the applied shield 1160 and the sensor arrangement 1100 (not shown for clarity).

In relation to temperature compensation, an advantage of using the semiconducting layer, beyond electric field gradient control, is that, in a practical cable, the semiconducting layer is typically moulded to the dielectric layer, resulting in a close mechanical union. By building on top of this, the sensor geometry is better defined and more easily follows the cable thermal expansion and contraction. Furthermore, if the metallic electrode used to build the coupling capacitor has non-uniformities in its application, the semiconducting layer with which it is in contact will ensure that the effective capacitor cylinder is in fact that section of the semiconducting layer with which the copper is in contact, and is thus always smooth and perfectly attached to the dielectric layer. This reduces the requirements on the mechanical build-up of the sensor.

The use of a spring-like or elastic electrode assembly could be implemented to ease installation and to give the whole a better capacity to stay in contact with the cable, while allowing free thermal expansion and contraction of said cable. The semiconducting layer under the construction serves as the functional capacitor cylinder conductor, while the spring-like or elastic electrode serves to keep in close electric contact with the layer, provide a sufficiently conductive contact surface to the semiconducting layer, and still allow enough flexibility to follow expansion/contraction. This is possible, as the conductivity of the semiconducting layer is high compared to the impedance of the coupling capacitor, and the added resistivity due to the short sections of the semiconducting layer can be considered to be negligible.

The main issues encountered with the capacitive coupling build on top of the semiconducting layer are those, as described above, of the very high impedance offered by the coupling capacitor for the grid fundamental and the highly variable impedance of the semiconducting layer to ground.

Figure 8:
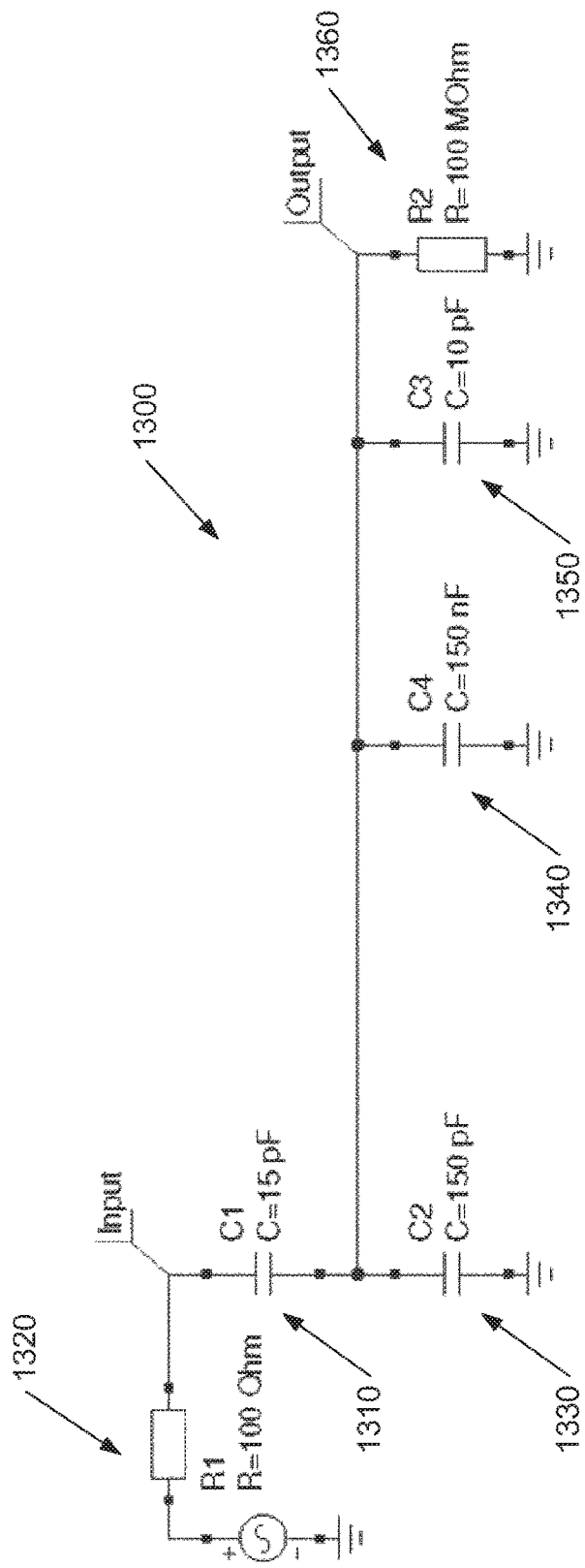
FIG. 8 is a circuit diagram of a first sensor simulation model.

In FIG. 8, the basic configuration for a capacitive voltage divider is shown to illustrate the detrimental effect of the semiconducting layer (or contamination) on the sensor, if no compensation techniques are implemented. An idealised model for a voltage sensor circuit 1300 having a coupling capacitor 1310 having a capacitance of 15 pF, the capacitor 1310 receiving an input from a voltage supply 1320 operating at 10 kV and 50 Hz is shown. Parasitic capacitance from the coupling capacitor 1310 to the cable shield is represented by capacitance 1330 and this is typically 150 pF. A loading capacitor 1340 is used to set the voltage division ratio, and capacitor 1350 and resistor 1360 represent a fair approximation of the input properties of a signal conditioning circuit (not shown). The loading capacitor 1340 may have a capacitance of 150 nF, capacitor 1350 a capacitance of 10 pF and the resistor 1360 a resistance of 100 MΩ.

Figure 9:
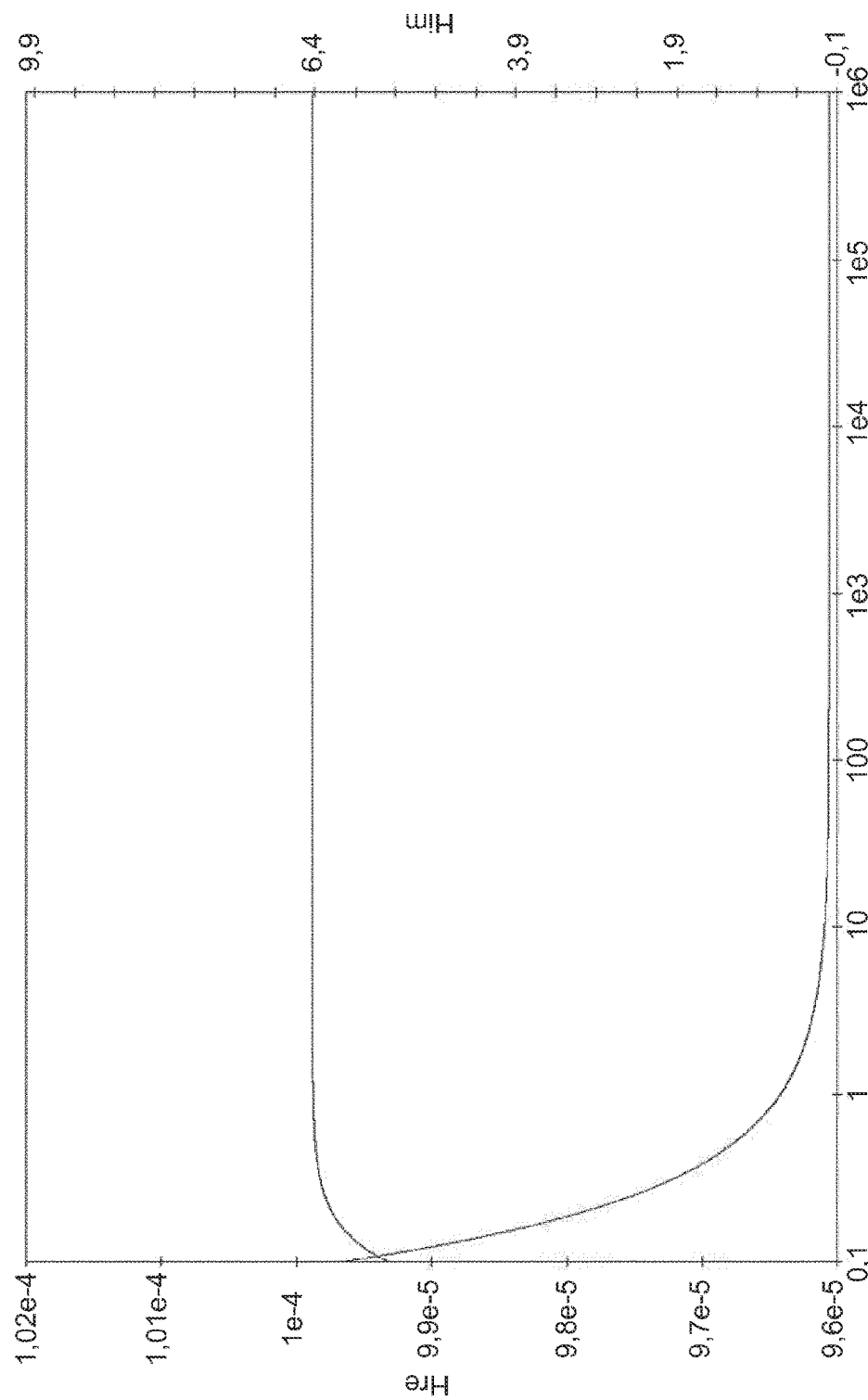
FIG. 9 is a graph illustrating simulated frequency response for the sensor simulation model of FIG. 8.
Figure 12:
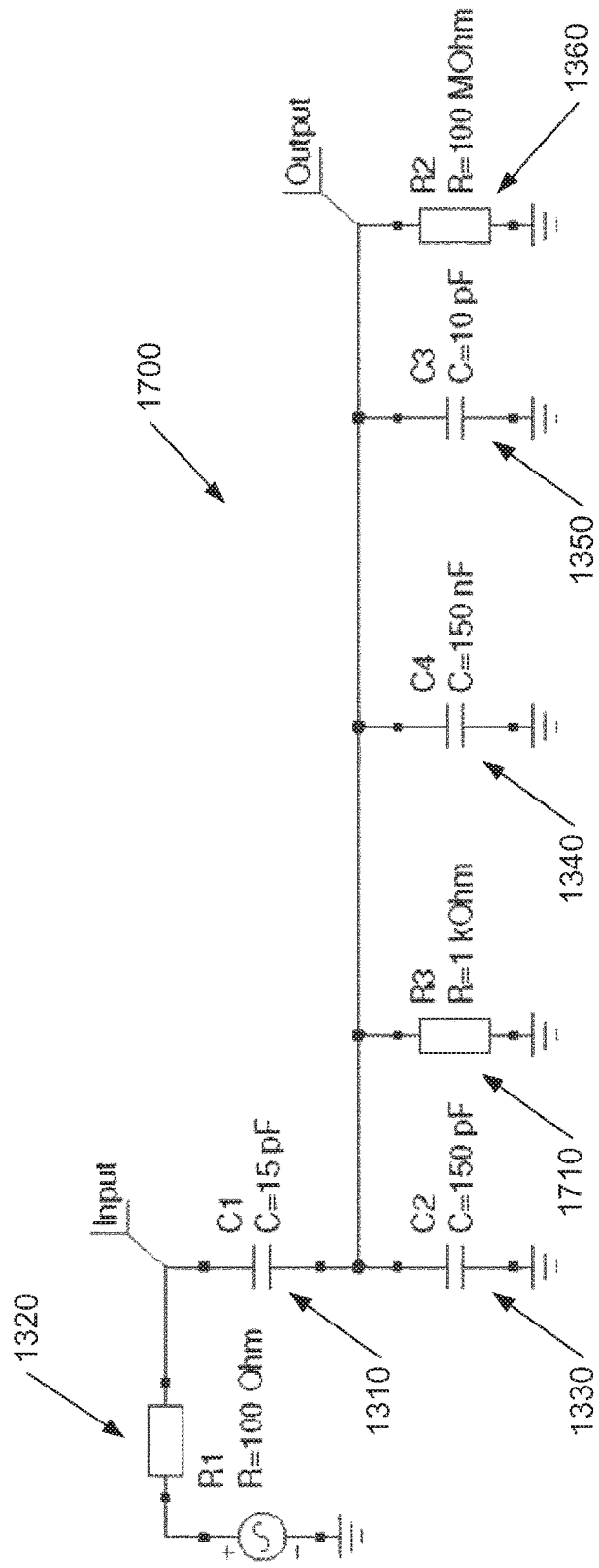
FIG. 12 is a circuit diagram of a third sensor simulation model.
Figure 13:
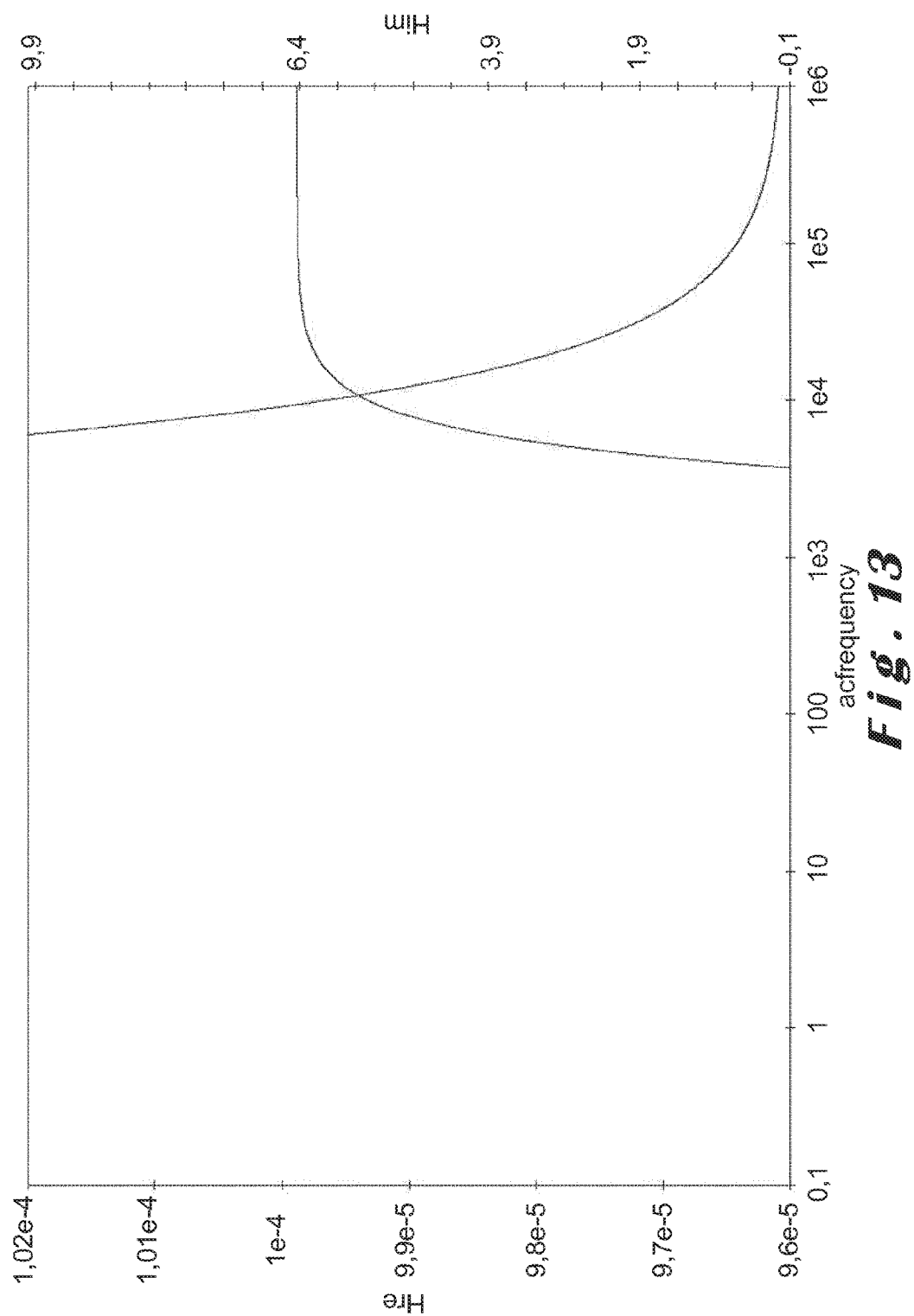
FIG. 13 is a graph illustrating simulated frequency response for the sensor simulation model of FIG. 12.

FIG. 9 shows the frequency response of the circuit of FIG. 13. Here, the X-axis is in Hz, the left Y-axis is the ratio $V_{out}/V_{in}$, and the right Y-axis is in degrees. The performance is very good over a very wide frequency range. The configuration relates closely to the arrangement described in DE-A-3702735 discussed above. Starting from this point, the issues of sensor contamination and the use of the semiconducting layer are described with reference to FIGS. 10 to 13.

Figure 10:
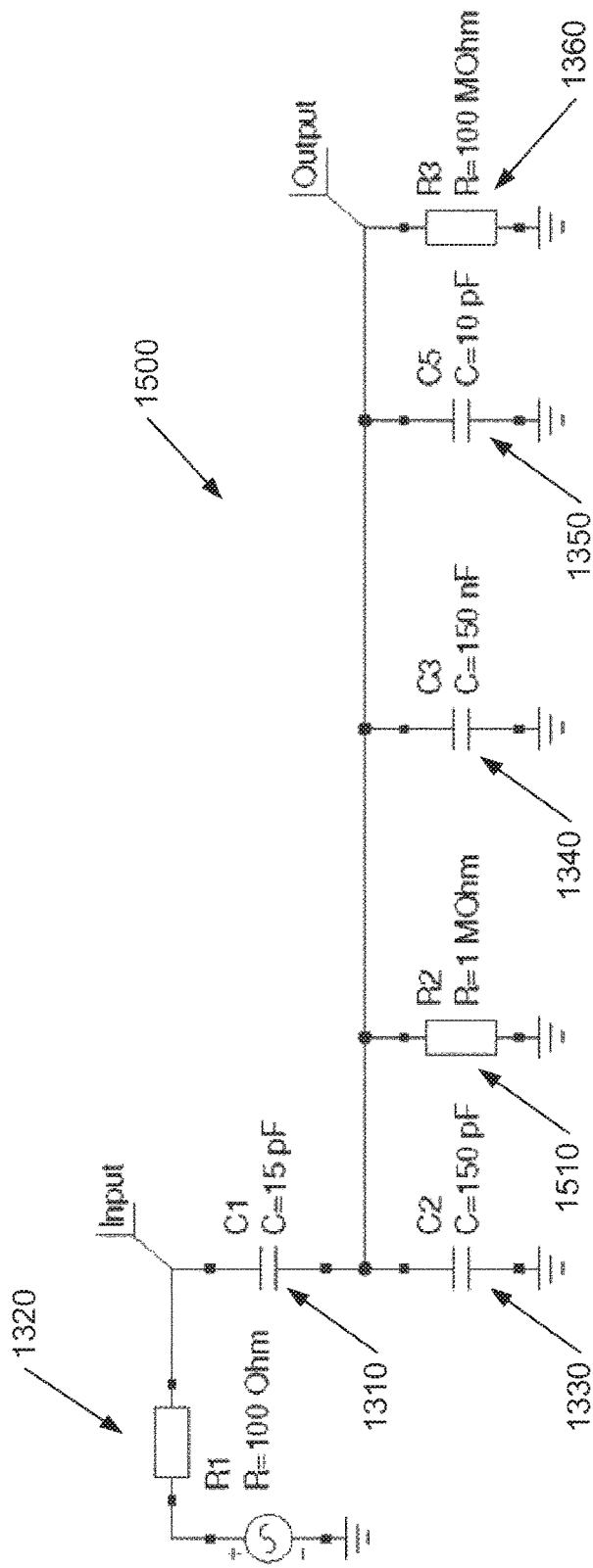
FIG. 10 is a circuit diagram of a second sensor simulation model.
Figure 11:
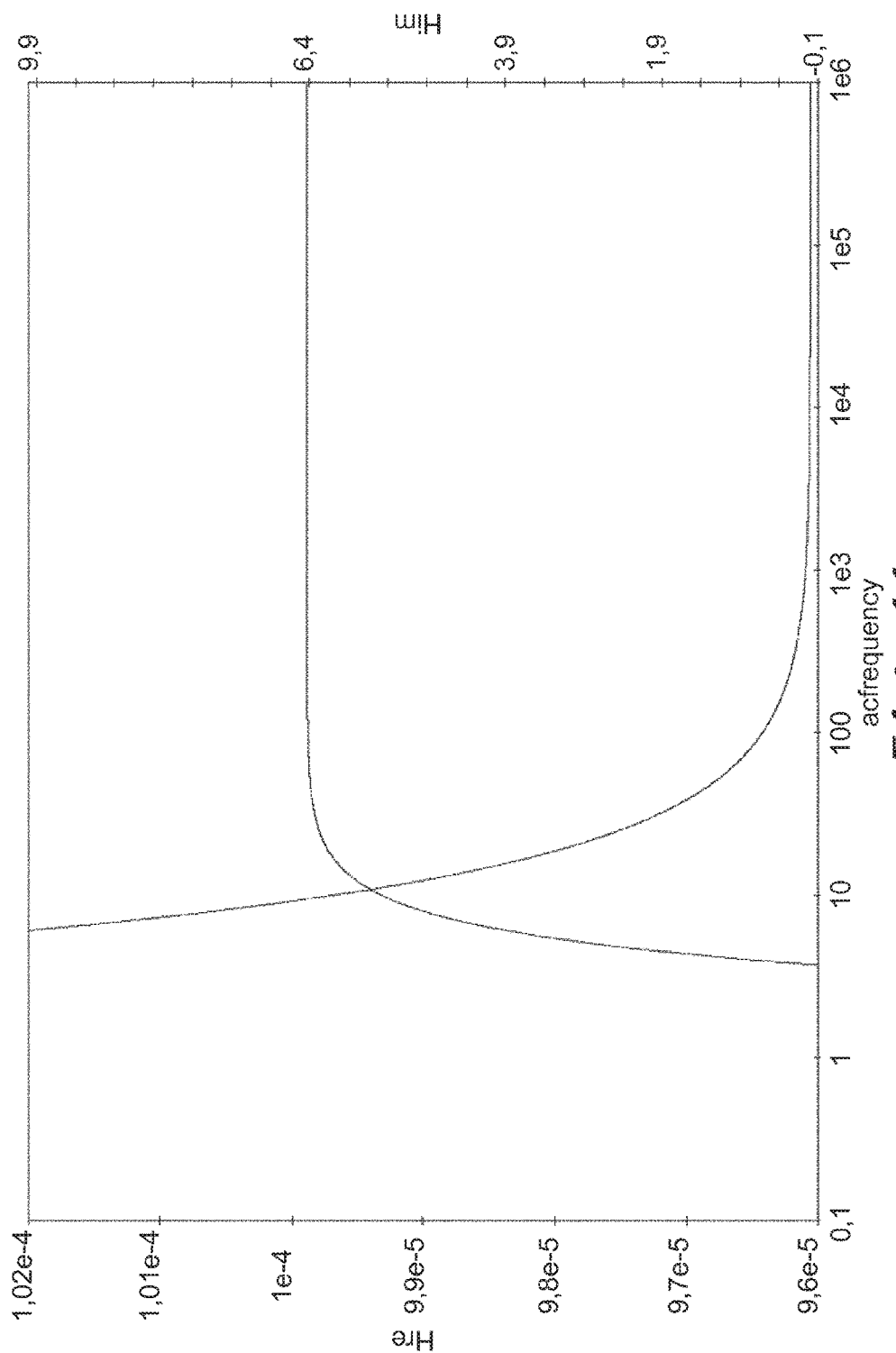
FIG. 11 is a graph illustrating simulated frequency response for the sensor simulation model of FIG. 10.

FIG. 10 illustrates a voltage sensor circuit 1500 that is identical to FIG. 8 apart from the addition of some contamination. This contamination is represented by resistor 1510 and has a value of 1 MΩ. This value can easily be obtained due to the presence of a small amount of moisture in the structure. The resulting degraded frequency response is shown in FIG. 11. The axes are labelled the same as in FIG. 9 and have the same scale.

Compensation for contamination is difficult as the contamination is usually unknown and can be time-variant. As shown in FIG. 11, it can readily be seen that even slight contamination ruins the sensor precision.

Additionally, the effects of the semiconducting layer are shown in FIG. 12. FIG. 12 illustrates a voltage sensor circuit 1700 that is identical to that of FIG. 8 but with resistor 1710 representing the effects of the semiconducting layer. Resistor 1710 typically has a value of 1 kΩ. The layer may be thought of as an extreme case of contamination. Here, a severely degraded sensor response is obtained as shown in FIG. 13. The axes are labelled the same as in FIG. 9 and have the same scale. As before, due to the large variability of the semiconducting layer conductivity with temperature, as well as the possibility for additional contamination, both thus being time-variant, and therefore compensation can be difficult.

For ease of comparison, the scales used in FIGS. 9, 11 and 13 are the same. However, the scales used for subsequent Figures may differ.

When a current mode operation with implicit guarding technique is used, significant improvements in sensor performance can be obtained as described with reference to and illustrated in FIGS. 14 and 15. In each case, the semiconducting layer is used.

Figure 14:
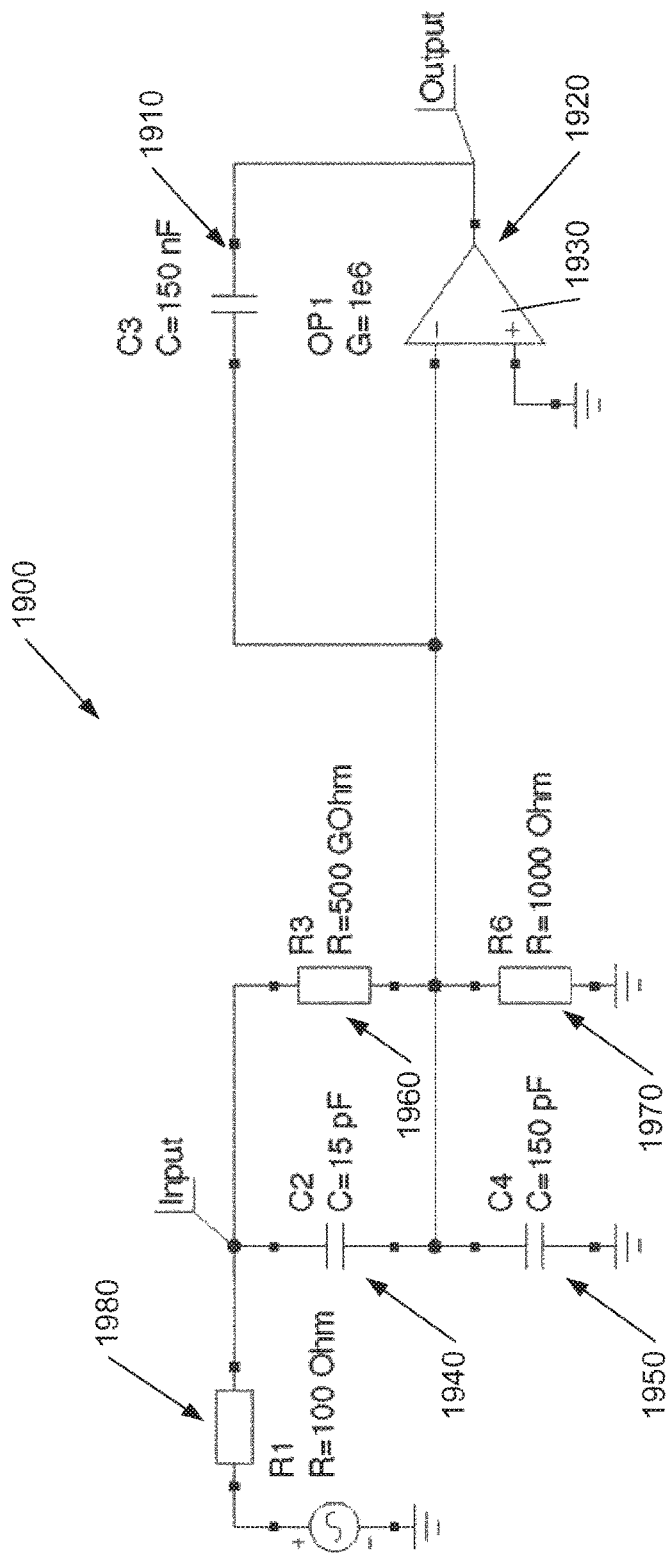
FIG. 14 is a circuit diagram of a sensor current-mode simulation model.
Figure 15:
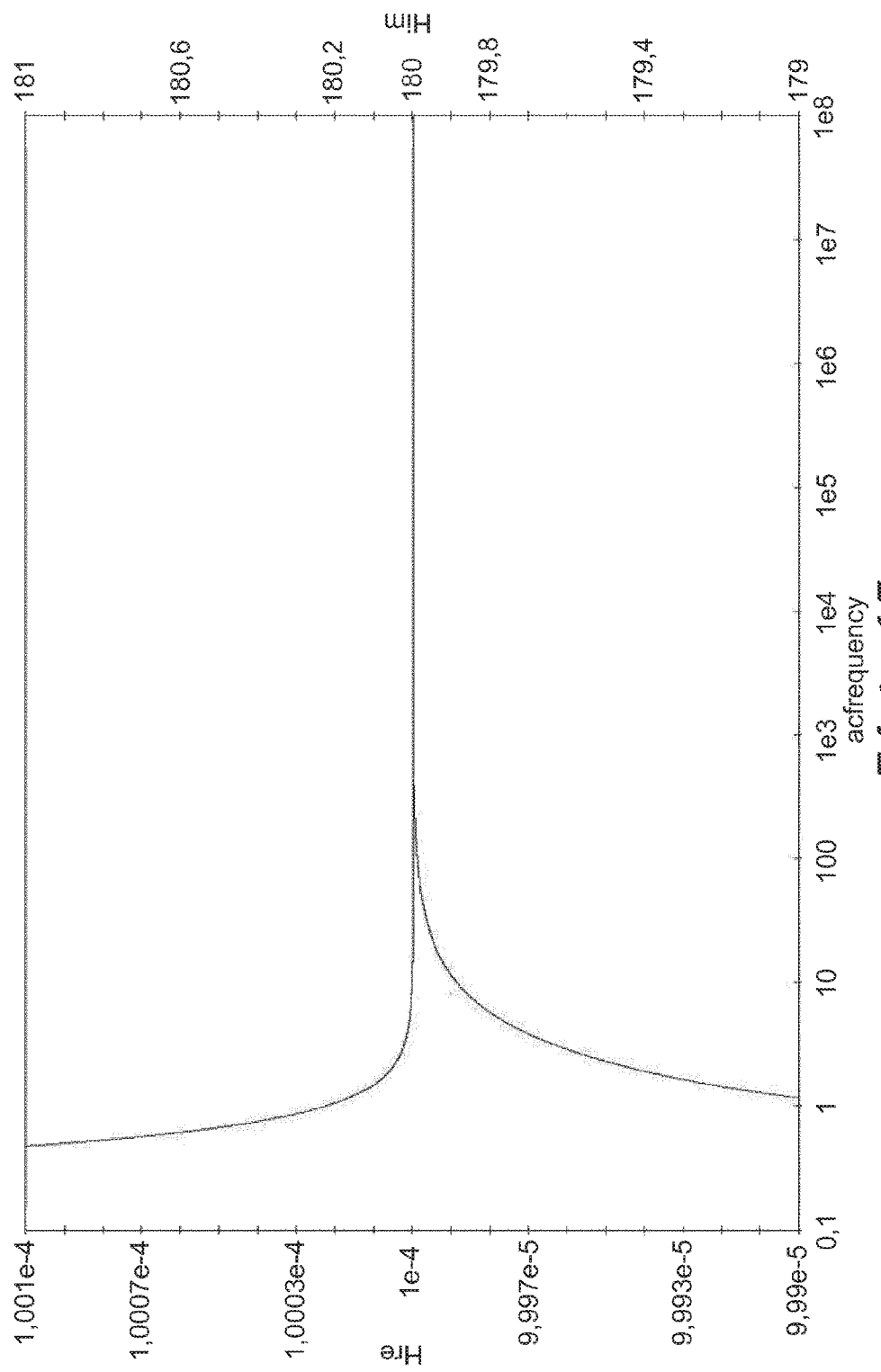
FIG. 15 is a graph illustrating simulated frequency response for the sensor simulation model of FIG. 14.

An idealised current-mode implementation of the sensor circuit 1900 with a signal conditioning circuit is shown in FIG. 14. Here, the sensor circuit 1900 includes implicit guarding. The salient sensor parasitic impedances are also shown. A charge amplifier is used to implement ground-referenced current-input signal conditioning in this case. In comparison with FIGS. 8, 10 and 12 described above, loading capacitor 1910 is implemented as part of an integrator 1920 based around an operational amplifier 1930. Capacitors 1940, 1950 represent parasitic and loading capacitances respectively. Resistor 1960 represents the cable dielectric conductivity and resistor 1970 represents the conductivity of the semiconducting layer. Input 1980 is the same as that of FIGS. 8, 10 and 12 described above. The integration in this circuit also compensates for the differentiating effect of the coupling capacitor to provide an output voltage that is an inverted, scaled version of that on the central cable conductor. FIG. 15 shows the simulated results with the axes labelled the same as in FIG. 9 but the scales are different on both Y-axes. It is to be noted that as the sensor circuit 1900 is inverting, there is a 180° phase offset. However, the sensor response is significantly improved.

As described above with reference to FIGS. 14 and 15, both the current-mode with implicit guarding allows the use of the semiconducting layer in a practical sensor.

Prototype sensors were constructed to validate the use of such sensors in practice. A current-mode prototype was built on top of the semiconducting layer of a medium-voltage cable section. The sensor was tested at 400 Vpp over a wide range of frequencies. The sensor was shown to perform well, illustrating good performance even for a basic prototype. More detailed results were obtained using a Dranetz 305 (PA3009 plug-in) phase/magnitude meter. The results obtained are shown in Table 1 below:

TABLE 1

| Frequency (Hz) | Phase Error (degrees) | Amplitude Ratio (dB) |
|---|---|---|
| 10 | −7 | −44.4 |
| 20 | −0.6 | −40.8 |
| 30 | −0.1 | −40.4 |
| 40 | 0 | −40.3 |
| 50 | 0 | −40.2 |
| 100 | 0 | −40.1 |
| 500 | −0.6 | −40.0 |
| 1000 | −1.3 | −40.0 |
| 1500 | −2.0 | −40.0 |
| 2000 | −2.7 | −40.0 |

Ideally, there should be zero phase error and an amplitude ratio of 40 dB (1:10000).

Figure 16:
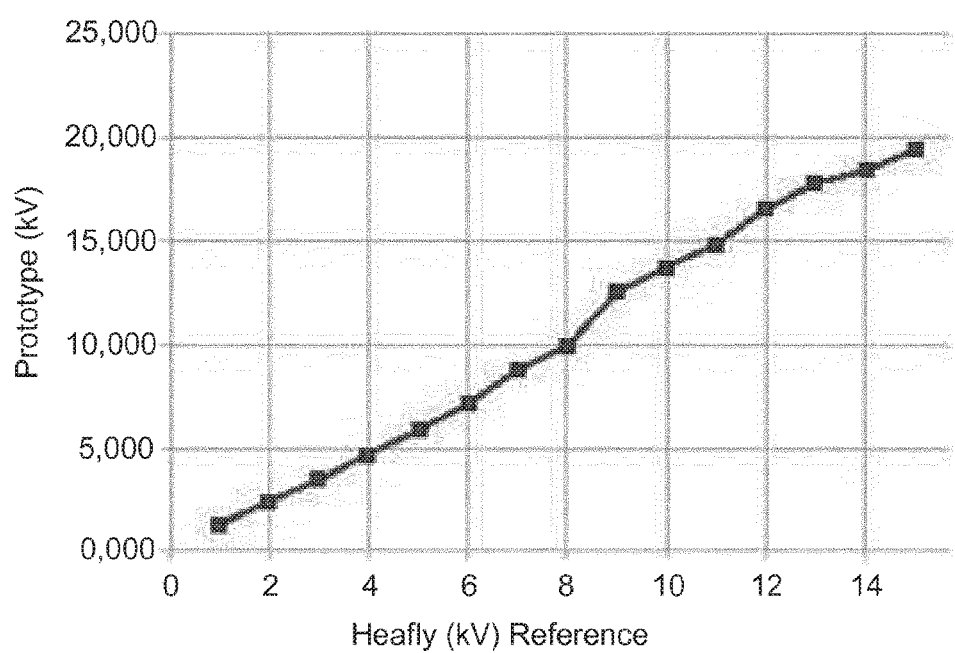
FIG. 16 is a graph illustrating sensor linearity for a current-mode sensor.

Next, the device was evaluated at high-voltage. Here, excitation was only possible for 50 Hz but this still allowed evaluation of the linearity of the device for increasing voltage. A Haefely DMI 551 was used for the reference measurement but the sensor output was not calibrated for this comparison. The device was found to perform well, better than the accuracy (few percent) of the instruments available, from a few hundred volts rms up to 8 kV rms. It was found that higher input values started to saturate the simple conditioning amplifier used in the comparison, causing the curve to deviate from the ideal linear relationship between the reference and sensor values. The results are shown in FIG. 16. It is to be noted that this deviation from the ideal linear relationship in not a limitation of the technique, merely of the specific prototype implementation and chosen division ratio.

Figure 17:
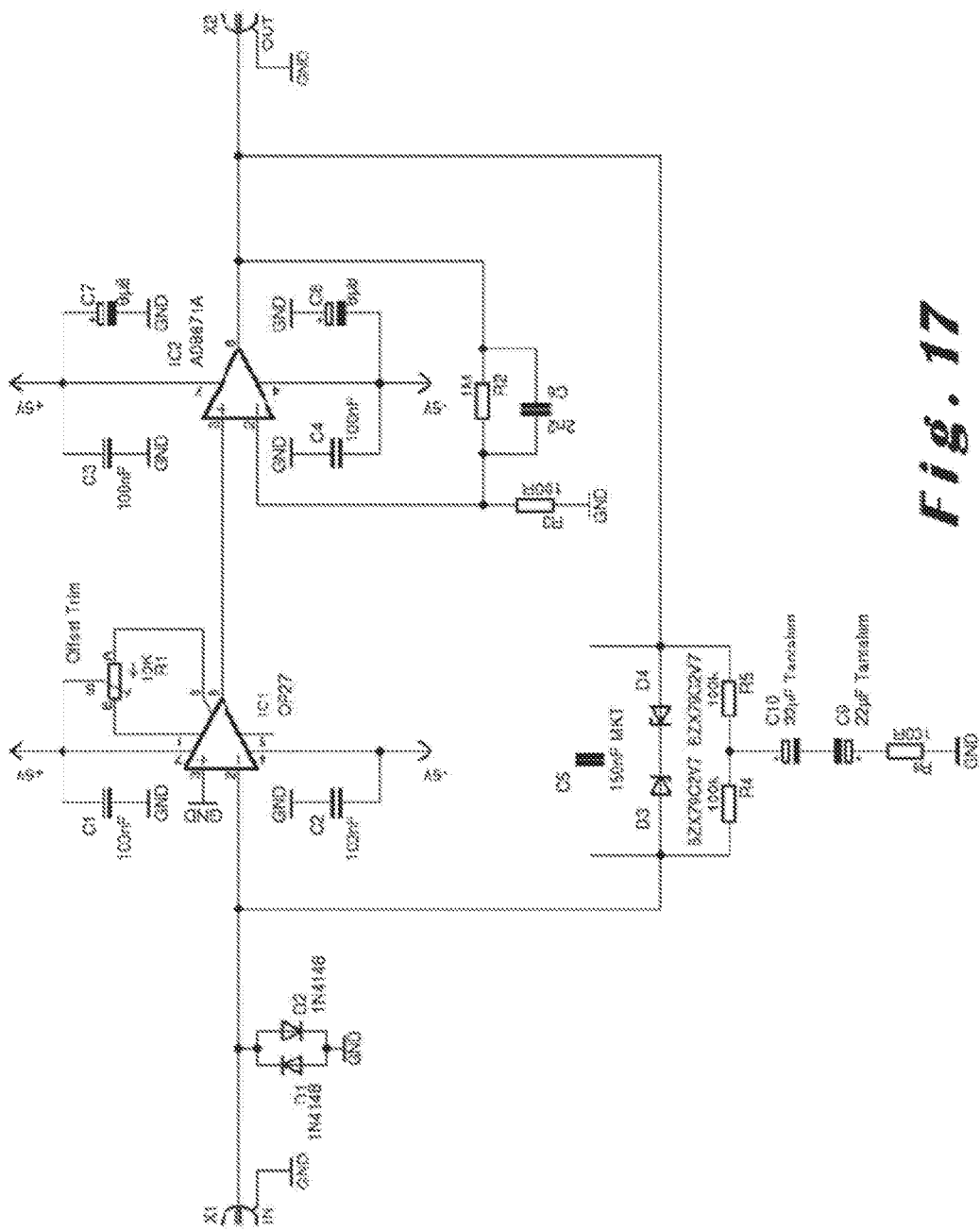
FIG. 17 illustrates a signal conditioning circuit in accordance with the present invention.

FIG. 17 illustrates a signal conditioning circuit 2000 for processing the signals obtained by the sensor. It implements a leaky integrator which, combined with the sensor coupling capacitance, yields a scaled inverse of the voltage on the cable.

The voltage at the input of the signal conditioning circuit should be as close as possible to the reference potential of the cable shield. This is, in practice, ground potential. The circuit should thus not develop a voltage over its input due to the current flowing through it.

As the circuit takes as input a current from the coupling capacitor, this means that the input impedance must be as close to zero as possible, so that no voltage is developed over this input as a result of the current. Furthermore, the circuit must be referenced to the reference potential of the cable shield. In practice, the circuit achieves this by means of a Miller integrator based on an operational amplifier. For the conditions described above to hold true, a high gain of at least $10^6$ is required over the frequency range of interest. Furthermore, the circuit output driver must be able to match the input current, so that the zero input voltage condition may be obtained at the virtual ground point at the negative terminal of the operational amplifier. These combined requirements are generally unfeasible with commercially available operational amplifiers. Their DC gain, indeed, easily exceeds the required gain, but it quickly rolls-off to become insufficient for the power system fundamental frequency and beyond.

The signal conditioning circuit 2000 is in the form of a composite amplifier where two operational amplifiers (OPAMPs) combine gain, accuracy, and drive capability to result in a gain stage with sufficient gain and output current to implement a successful Miller integrator for the voltage measurement sensor of the present application.

The basic Miller integrator is based on an inverting gain stage with sufficient open-loop gain at the required frequencies as to be as close as possible to an infinite inverting gain approximation. Feedback, through a capacitor, relates to the integrator time constant. The current-to-voltage conversion occurs on the virtual ground obtained at the negative terminal of the operational amplifier. Ordinarily, this input is connected to the signal source through a resistor, converting the applied voltage to an input current. This input current is matched, through the integrating capacitor, from the output of the operational amplifier, yielding the integrating function. In the circuit shown in FIG. 17, this resistor is omitted and the inverting input connected directly to the coupling capacitor, yielding a charge amplifier-type circuit.

In the circuit of FIG. 17, the gain stage is composed of operational amplifiers IC1 and IC2, while the integrator capacitor is C5.

The first issue with the basic Miller circuit is that, in practice, no amplifier is able to maintain a perfect offset voltage. There always remains a small DC voltage error between input and output of the amplifier, which results in a small DC term which is integrated by the integration capacitor. This results in an increasing DC voltage over this capacitor, until the amplifier saturates. A leakage path is therefore provided, which allows this error current to discharge. From a transfer function perspective, the aim is to reduce the DC gain of the integrator below unity, so the DC term is attenuated without affecting the AC gain.

Typically, this leakage path is implemented with a single resistor in parallel with the integration capacitor C5. However, this results in insufficient low-frequency performance, in this case, for the power frequency fundamental. An implementation based on a frequency-dependent T-network that bridges C5 is utilised. Components R4, R5, R6, C9, and C10 comprise this network. The bridged T has a frequency response chosen so that the "leak" becomes frequency-dependent, allowing sufficient remaining gain at the power system frequencies of interest.

Intuitively, this network may be understood that, for higher frequencies, the uni-polar capacitor composed of C9 and C10 becomes effectively a short, reducing the T to a classic resistive case composed of R4, R5, and R6. This resistive configuration is known as a means of composing very high-valued impedance using much lower-valued resistances, effectively achieving a resistance multiplication effect which produces much less noise than a normal, high-valued resistor would produce. This resistive T is parallel to C5, which has relatively low impedance at these higher frequencies to the very high impedance of the T. As a result, the effect of the T on the integrator transfer function is negligible.

For low frequencies, then, the uni-polar capacitor C9 and C10 becomes effectively an open circuit, opening the grounded leg of the T. This results in C5 being paralleled by the series combination of R4 and R5 only, which is a very low impedance compared to that of C5 for those low frequencies. In this case, the resistive component dominates the transfer function. Combined with the very high impedance of the sensor coupling capacitor, the overall gain of the integrator is much below unity for DC, thus removing the offset drift and associated saturation problems.

The second issue with the basic Miller circuit is achieving enough open-loop gain for higher frequencies, as well as sufficient output drive capability. In order to obtain this required high AC gain, exceeding 120 dB for the frequencies of interest, a composite amplifier is built using IC1 and IC2. The parts were chosen to obtain good DC accuracy, low drift, low noise, high gain, and sufficient output current. Stability is maintained by rolling-off the gain for IC2, set to provide 80 dB at low frequencies by R2 and R3, through the C6 bypass.

Diodes D3 and D4 provide assistance in maintaining stability after an input transient, helping the composite amplifier to prevent saturation during those events, and significantly speed-up recovery while avoiding sustained oscillations. They achieve this effect by limiting the voltage over the integrator capacitor to a level that prevents output saturation for both OPAMPs. These diodes do, however, start to conduct partially before their rated voltage, resulting in errors for higher input magnitudes to the circuit.

In a trial, the circuit was powered by a symmetrical +−5V supply. Operating the circuit at a higher supply voltage, for example, at +−15V, and increasing the Zener voltage of D3 and D4 relative to the supply voltage, for example, to 12V, will resolve the issue while maintaining a sufficient linear input range for practical use.

Capacitors C1, C2, C3, C4, C7, C8 are power supply by-pass capacitors for the operational amplifiers. Diodes D1 and D2 provide input protection network for the amplifier, clipping the input to the forward voltage drop of the diodes, about 0.7V. R1, finally, is the offset null adjustment for the composite amplifier, to minimise the DC drift of the integrator, allowing the minimisation of the requirements on the integrator leakage network.

Although the present invention has been described with reference to the use of the semiconductor layer and current-mode implicit guard techniques, it will be appreciated that these two techniques need not be used at the same time. However, significant advantages may be obtained through their combined use.

It will be appreciated that, although voltage measurements can be achieved using the particular sensor arrangements describe above, other sensor arrangements can be implemented that utilise the structure of the electrical cable whose voltage is to be measured.

The invention claimed is:

1. Measurement apparatus for measuring the voltage of an insulated electrical cable including at least one central conductor, a first dielectric layer surrounding the at least one central conductor, a semiconducting layer surrounding the first dielectric layer and a cable shield surrounding the semiconducting layer, the apparatus comprising:
a sensing electrode assembly arranged around the semiconducting layer of the cable, comprising a sensing electrode element constructed on top of and connected to the semiconductor layer, such that a sensing capacitor is formed by the semiconductor layer together with the at least one central conductor and at least the first dielectric layer of the insulated electrical cable;
an electrical circuit connected to the sensing electrode element; and
an arrangement for defining the effective sensing area of the sensing electrode assembly;
wherein the electrical circuit comprises a current-mode signal conditioning circuit, an input of the current-mode signal conditioning circuit being connected to the sensing electrode element and being referenced to a ground potential of the current-mode signal conditioning circuit, to which the cable shield is connected, the current-mode signal conditioning circuit being arranged for compensating parasitic impedances of the semiconductor layer by actively driving its input impedance towards zero; and
wherein the sensing electrode assembly enables the detection of the voltage of the insulated electrical cable.

2. Measurement apparatus according to claim 1, wherein said arrangement for defining the effective sensing area is formed by first and second additional electrode elements positioned either side of the sensing electrode element and being connected to the semiconductor layer.

3. Measurement apparatus according to claim 1, wherein said arrangement for defining the effective sensing area is formed by first and second clamping devices around edge portions of the cable shield on either side of the sensing electrode element.

4. Measurement apparatus according to claim 1, wherein the assembly further comprises a second dielectric layer placed over at least the sensing electrode element.

5. Measurement apparatus according to claim 4, wherein the assembly further comprises an electrostatic shield placed over the second dielectric layer.

6. Measurement apparatus according to claim 5, wherein the electrostatic shield is connected to the cable shield.

7. Measurement apparatus according to claim 5, wherein the electrostatic shield is part of the cable shield of the insulated electrical cable which extends along the electrical cable and over the second dielectric layer covering at least the electrode element.

8. Measurement apparatus according to claim 1, wherein the current-mode signal conditioning circuit is provided for converting an input current sensed on its input into an output voltage indicative of the voltage on the at least one central conductor.

9. Measurement apparatus according to claim 8, wherein the current-mode signal conditioning circuit comprises a charge amplifier with an integrating capacitor.

10. Measurement apparatus according to claim 9, wherein the integrating capacitor is well-chosen and thermally linked with the sensing capacitor such that temperature dependence of the sensing capacitor is compensated for.

11. Measurement apparatus according to claim 8, wherein the current-mode signal conditioning circuit comprises a current-to-voltage converter, an integrator and a gain stage.

12. Measurement apparatus according to claim 8, wherein the current-mode signal conditioning circuit comprises a Miller integrator based on an operational amplifier.

13. Measurement apparatus according to claim 1, further comprising a temperature sensor associated with the electrode element.

14. Measurement apparatus according to claim 1, further comprising a multi-axial conductor that makes connections with the electrode elements.

* * * * *